(12) United States Patent
Maemuko

(10) Patent No.: US 10,154,618 B2
(45) Date of Patent: Dec. 11, 2018

(54) DISPLAY DEVICE

(71) Applicant: Japan Display Inc., Tokyo (JP)

(72) Inventor: Masanori Maemuko, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/920,989

(22) Filed: Mar. 14, 2018

(65) Prior Publication Data

US 2018/0279514 A1 Sep. 27, 2018

(30) Foreign Application Priority Data

Mar. 21, 2017 (JP) ................................. 2017-055114

(51) Int. Cl.
| | |
|---|---|
| *H05K 9/00* | (2006.01) |
| *H05K 1/02* | (2006.01) |
| *G02F 1/1333* | (2006.01) |
| *H01R 4/34* | (2006.01) |
| *H05K 1/11* | (2006.01) |
| *F21V 8/00* | (2006.01) |
| *H05K 1/14* | (2006.01) |
| *H01L 51/52* | (2006.01) |

(52) U.S. Cl.
CPC ......... *H05K 9/0026* (2013.01); *G02B 6/0088* (2013.01); *G02F 1/133308* (2013.01); *H01R 4/34* (2013.01); *H05K 1/0215* (2013.01); *H05K 1/117* (2013.01); *H05K 9/0054* (2013.01); *G02F 2001/133314* (2013.01); *G02F 2001/133334* (2013.01); *H01L 51/5237* (2013.01); *H05K 1/147* (2013.01); *H05K 9/0058* (2013.01); *H05K 2201/09063* (2013.01); *H05K 2201/0999* (2013.01); *H05K 2201/10128* (2013.01); *H05K 2201/10136* (2013.01); *H05K 2201/10371* (2013.01); *H05K 2201/10409* (2013.01)

(58) Field of Classification Search
None
See application file for complete search history.

(56) References Cited

U.S. PATENT DOCUMENTS

| | | | | |
|---|---|---|---|---|
| 6,358,065 | B1 * | 3/2002 | Terao ................ | G02F 1/133308 349/150 |
| 6,377,473 | B1 * | 4/2002 | Huang ................ | H05K 9/0026 361/800 |
| 8,582,046 | B2 * | 11/2013 | Lee ...................... | G02B 6/0088 349/56 |
| 9,521,741 | B1 * | 12/2016 | Wang .................. | H05K 1/0216 |

(Continued)

FOREIGN PATENT DOCUMENTS

JP 2008-185764 A1 8/2008

*Primary Examiner* — Xanthia C Cunningham
(74) *Attorney, Agent, or Firm* — K&L Gates LLP

(57) ABSTRACT

According to an aspect, a display device includes: a display panel; a housing; a printed circuit board; a boss that penetrates a first through hole in the printed circuit board and protrudes from a surface of the housing, the surface being attached to the printed circuit board; a shield cover; and a male screw. The shield cover includes: a top plate; side plates; and a contact piece formed by folding a part of one of the side plates inward and including a protrusion in contact with a ground pattern of the printed circuit board and a claw facing the top plate. The protrusion causes the claw to protrude toward the printed circuit board. The male screw is fastened to the boss from the outside of the top plate.

8 Claims, 11 Drawing Sheets

(56) References Cited

U.S. PATENT DOCUMENTS

| | | | |
|---|---|---|---|
| 2002/0019154 A1* | 2/2002 | Na | H05K 1/147 439/76.1 |
| 2002/0080298 A1* | 6/2002 | Fukayama | G02F 1/133308 349/58 |
| 2006/0170839 A1* | 8/2006 | Yamamoto | G02F 1/133308 349/58 |
| 2008/0106884 A1* | 5/2008 | English | H05K 9/0032 361/818 |
| 2008/0180931 A1 | 7/2008 | Ogawa | |
| 2009/0067141 A1* | 3/2009 | Dabov | H01Q 1/243 361/753 |
| 2012/0147573 A1* | 6/2012 | Lim | H05K 9/0028 361/753 |
| 2012/0176755 A1* | 7/2012 | Malek | H05K 3/32 361/752 |

* cited by examiner

DISPLAY DEVICE

CROSS-REFERENCE TO RELATED APPLICATIONS

This application claims priority from Japanese Application No. 2017-055114, filed on Mar. 21, 2017, the contents of which are incorporated by reference herein in its entirety.

BACKGROUND

1. Technical Field

The present invention relates to an electronic apparatus, such as a display device, including a shield cover to shield a printed circuit board.

2. Description of the Related Art

Japanese Patent Application Laid-open Publication No. 2008-185764 (JP-A-2008-185764), for example, discloses an electronic apparatus, such as a display device, employing a metallic shield cover to shield electronic components mounted on a printed circuit board.

The display device disclosed in JP-A-2008-185764 includes the shield cover fixed to a printed circuit board through a rear frame. With this configuration, contact resistance between the shield cover and a ground pattern on the printed circuit board may vary depending on the accuracy of machining on the rear frame.

For the foregoing reasons, there is a need for a display device exhibiting stable contact resistance between a shield cover and a ground pattern on the printed circuit board.

SUMMARY

According to an aspect, a display device includes: a display panel; a housing that accommodates the display panel; a printed circuit board including at least one ground pattern on one surface of the printed circuit board and a first through hole; a first boss that penetrates the first through hole and protrudes from a surface of the housing, the surface being attached to the printed circuit board; a metallic shield cover comprising: a top plate including a second through hole; side plates integral with the top plate and disposed along the periphery of the top plate; and a first contact piece formed by folding a part of one of the side plates inward and including a first protrusion in contact with the at least one ground pattern and a claw facing the top plate, the first protrusion causing the claw to protrude toward the printed circuit board; and a first male screw that penetrates the second through hole from outside of the top plate, and that is fastened to the first boss.

DETAILED DESCRIPTION

Figure 1:
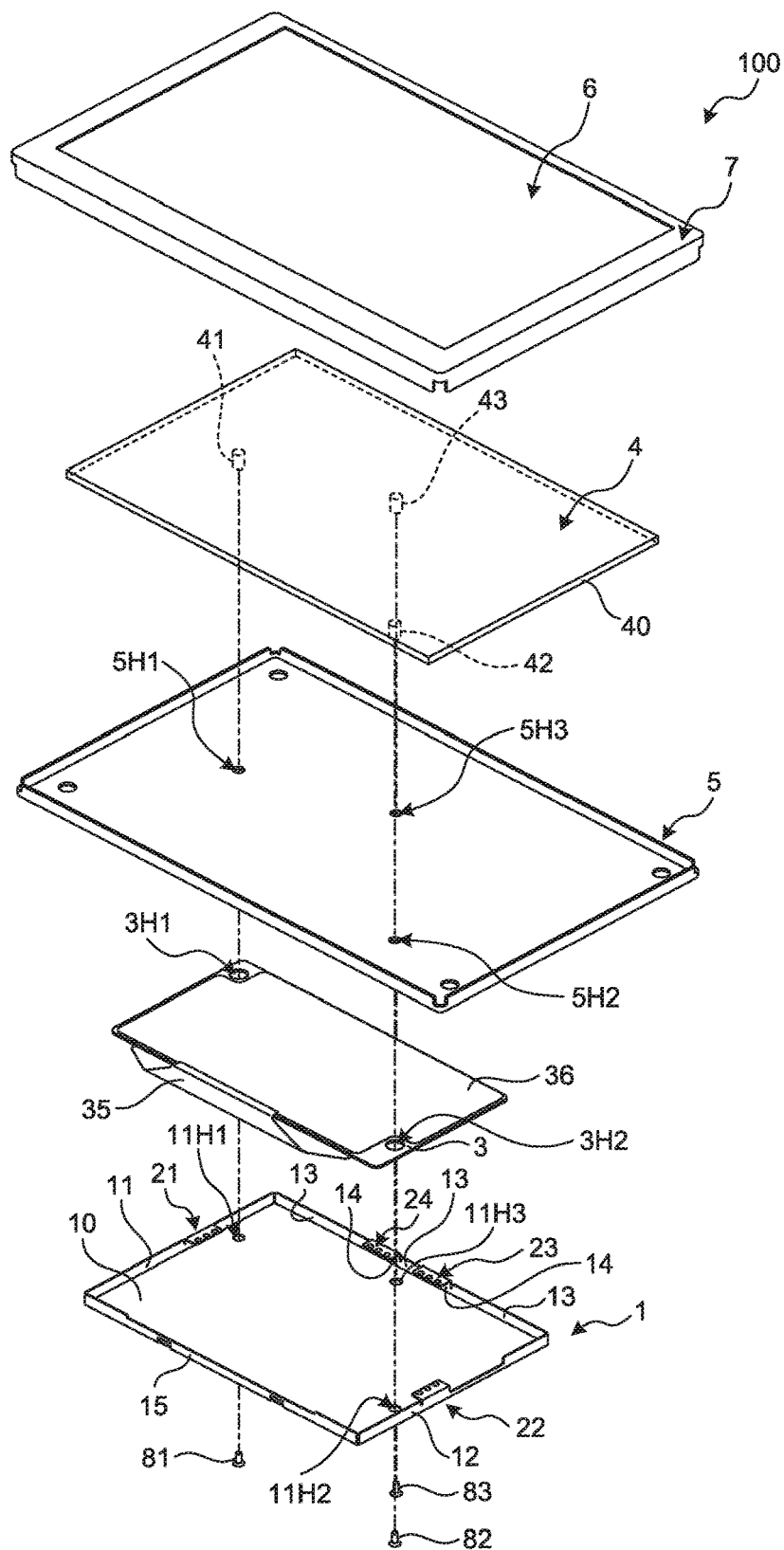
FIG. 1 is an exploded perspective view of a display device according to an embodiment of the present disclosure.

Modes (embodiments) for carrying out the present disclosure will be described below in detail with reference to the drawings. The contents described in the embodiments are not intended to limit the present disclosure. Components described below include components easily conceivable by those skilled in the art and components substantially identical therewith. Furthermore, the components described below can be appropriately combined. The disclosure is given by way of example only, and various changes made without departing from the spirit of the disclosure and easily conceivable by those skilled in the art naturally fall within the scope of the present disclosure. The drawings may possibly illustrate the width, the thickness, the shape, and other elements of each unit more schematically than the actual aspect to simplify the explanation. These elements, however, are given by way of example only and are not intended to limit interpretation of the present disclosure. In the specification and the drawings, components similar to those previously described with reference to a preceding drawing are denoted by like reference numerals, and overlapping explanation thereof will be appropriately omitted. In this disclosure, when an element A is described as being "on" another element B, the element A can be directly on the other element B, or there can be one or more elements between the element A and the other element B.

First Embodiment

FIG. 1 is an exploded perspective view of a display device according to a first embodiment of the present disclosure. A display device 100 is mounted on a dashboard of an automobile, for example, and is used for navigation display in a car navigation system, display on an audio operation screen, playback of a movie, and display of meters such as a speedometer, for example. As illustrated in FIG. 1, the display device 100 includes a display panel 6, a front case 7, a backlight 4, a back plate 5, a printed circuit board 3, and a shield cover 1.

The display panel 6 is a liquid crystal display panel including two translucent substrates, and liquid crystal sealed between the two translucent substrates. The display panel 6 displays an image by changing transmittance at each pixel in accordance with image signals. An X direction refers to a direction parallel to a plane of the display panel 6; a Y direction refers to a direction perpendicular to the X direction on the plane of the display panel 6; and a Z direction refers to a direction perpendicular to the X-Y plane. When viewed in the Z direction, a display surface side (or upper face side) refers to a side which a display surface (or upper face) to display an image faces; and a back surface side (or lower face side) refers to a side which a back surface (or lower face) opposite to the display surface faces.

One end of a flexible printed circuit (FPC) board 35 is coupled to the display panel 6. The other end of the FPC board 35 is coupled to the printed circuit board 3 to transmit control signals to the display panel 6, and control display operation. A protective cover may be disposed on the display surface side of the display panel 6. The protective cover is a translucent member to cover and protect the display surface of the display panel 6. Examples of the translucent member include, but are not limited to, a glass member, a translucent resin member, and a touch panel.

The backlight 4 is disposed on the back surface side of the display panel 6. The backlight 4 emits light toward the display panel 6 to make the light incident on the entire display region. The backlight 4 includes a backlight main body 40 and bosses 41, 42, and 43, for example. The backlight main body 40 includes a light source, and a light guide plate to guide light emitted from the light source toward the back surface of the display panel 6. The bosses 41, 42, and 43 protrude from the backlight main body 40 toward the back surface side. The bosses 41, 42, and 43 have respective female screw parts on their back surfaces.

The front case 7 and the back plate 5 are assembled into a housing. The display panel 6 and the backlight 4 are accommodated in an internal space enclosed by the front case 7 and the back plate 5.

The back plate 5 is formed by bending a plate-like metal member. The back plate 5 has a plurality of through holes including through holes 5H1, 5H2, and 5H3.

Figure 3:
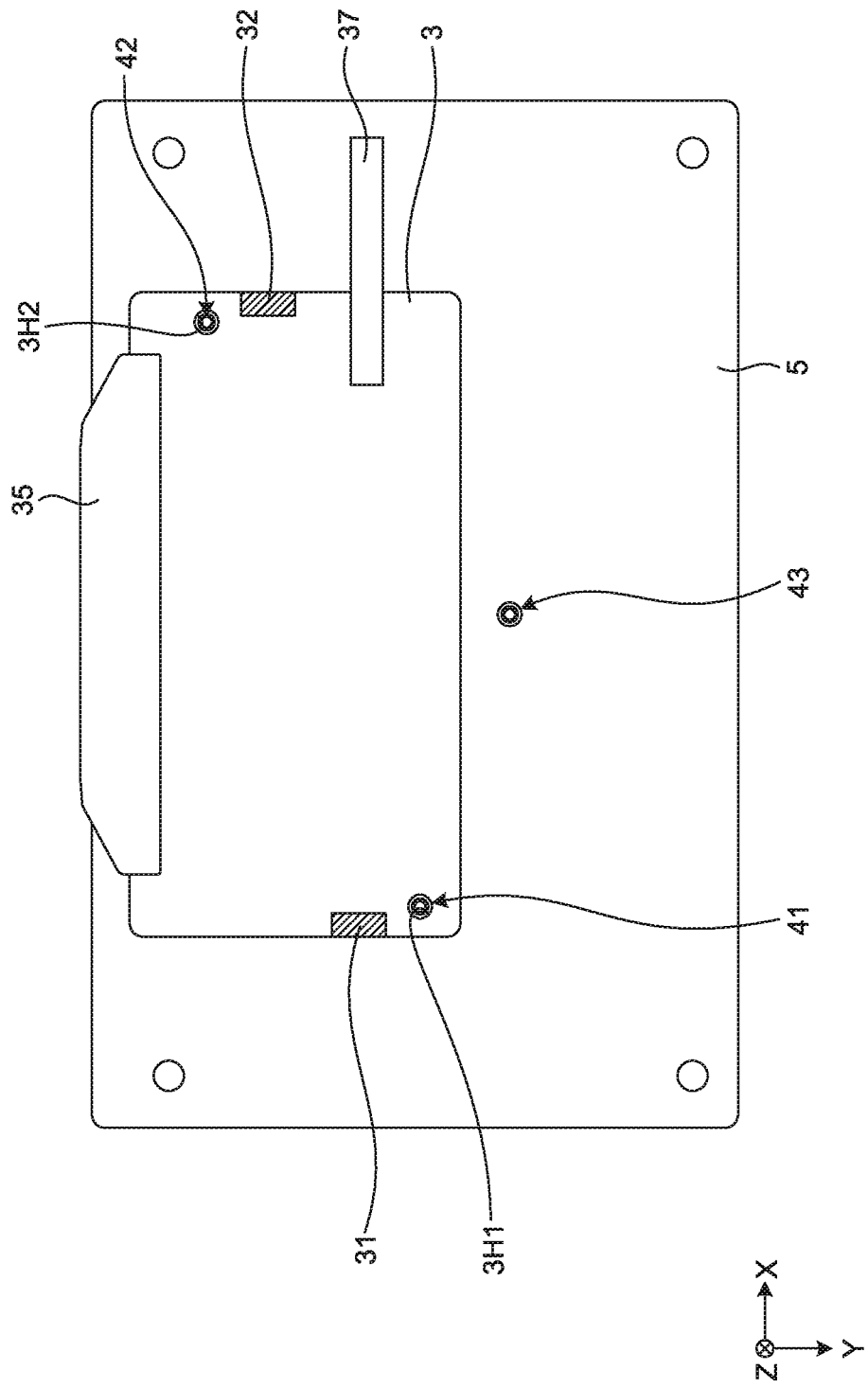
FIG. 3 is a back view illustrating a state of a printed circuit board fixed to a back plate.

FIG. 3 is a back view illustrating a state of a printed circuit board fixed to a back plate. The printed circuit board 3 has electronic components (not illustrated) mounted thereon. The printed circuit board 3 has through holes 3H1 and 3H2. An insulating resin film 36 is interposed between the printed circuit board 3 and the back plate 5.

As illustrated in FIG. 1, the printed circuit board 3 is disposed on the back surface side of the back plate 5. The through hole 3H1 overlaps the through hole 5H1 of the back plate 5. The boss 41 of the backlight main body 40 is inserted into the through hole 5H1 of the back plate 5 and into the through hole 3H1 of the printed circuit board 3. The through hole 3H2 overlaps the through hole 5H2 of the back plate 5. The boss 42 of the backlight main body 40 is inserted into the through hole 5H2 of the back plate 5 and into the through hole 3H2 of the printed circuit board 3.

Figure 2:
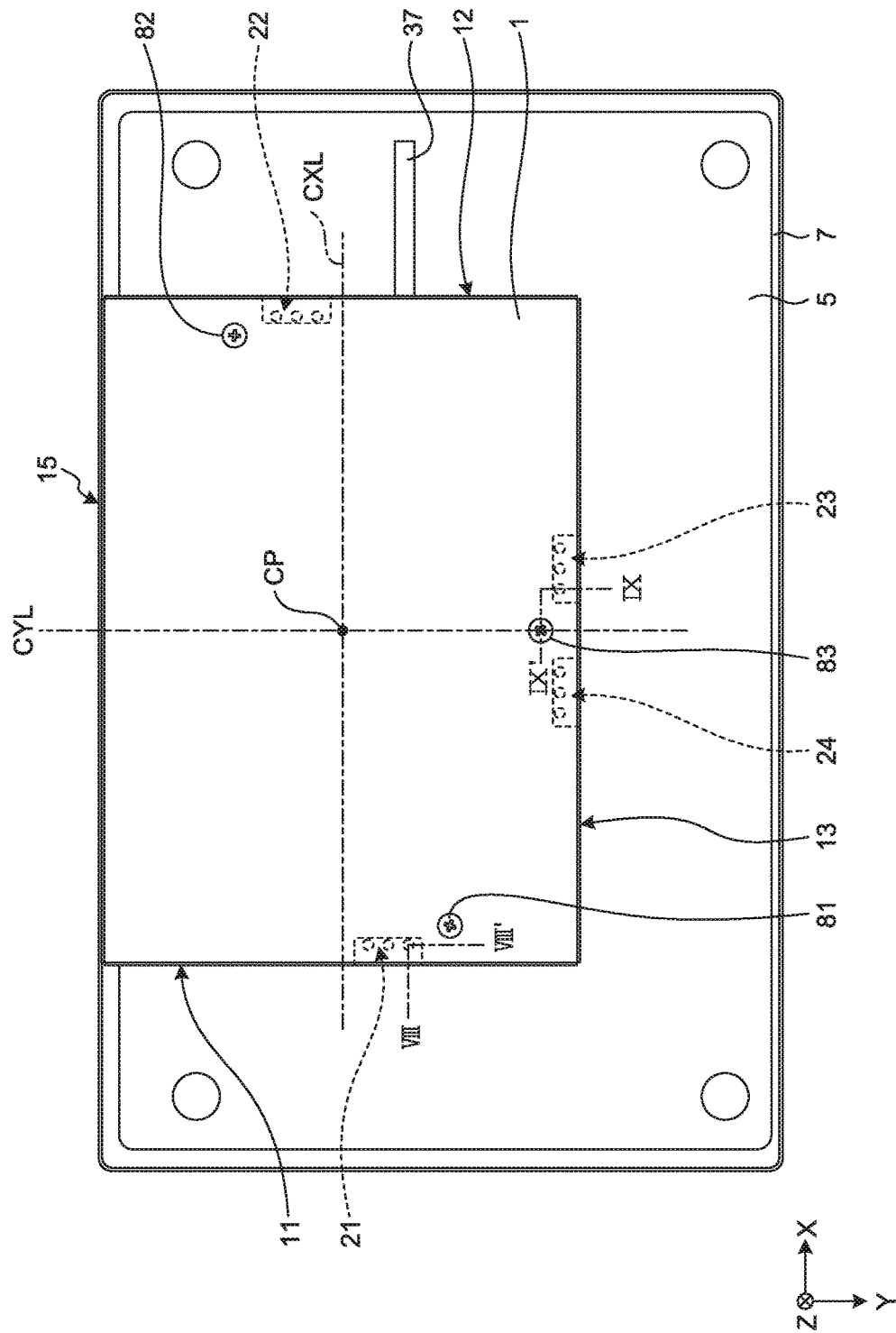
FIG. 2 is a back view of the display device.

As illustrated in FIG. 2 and FIG. 3, the one end of an FPC board 37, which is not illustrated in FIG. 1, is coupled to the printed circuit board 3. The other end of the FPC board 37 is coupled to the light source of the backlight 4 (see FIG. 1). As illustrated in FIG. 3, the printed circuit board 3 has ground patterns 31 and 32 on the back surface. The ground patterns 31 and 32 are coupled to a reference potential of the printed circuit board 3. The through hole 3H1 of the printed circuit board 3 is in the vicinity of the ground pattern 31. The through hole 3H2 of the printed circuit board 3 is in the vicinity of the ground pattern 32.

The shield cover 1 is a component to shield electronic components mounted on the printed circuit board 3. The shield cover 1 is formed by bending a plate-like metal member. FIG. 2 is a back view of the display device. As illustrated in FIG. 2, when viewed from the back surface side in the Z direction, the shield cover 1 is larger than the printed circuit board 3 and covers the printed circuit board 3.

Figure 4:
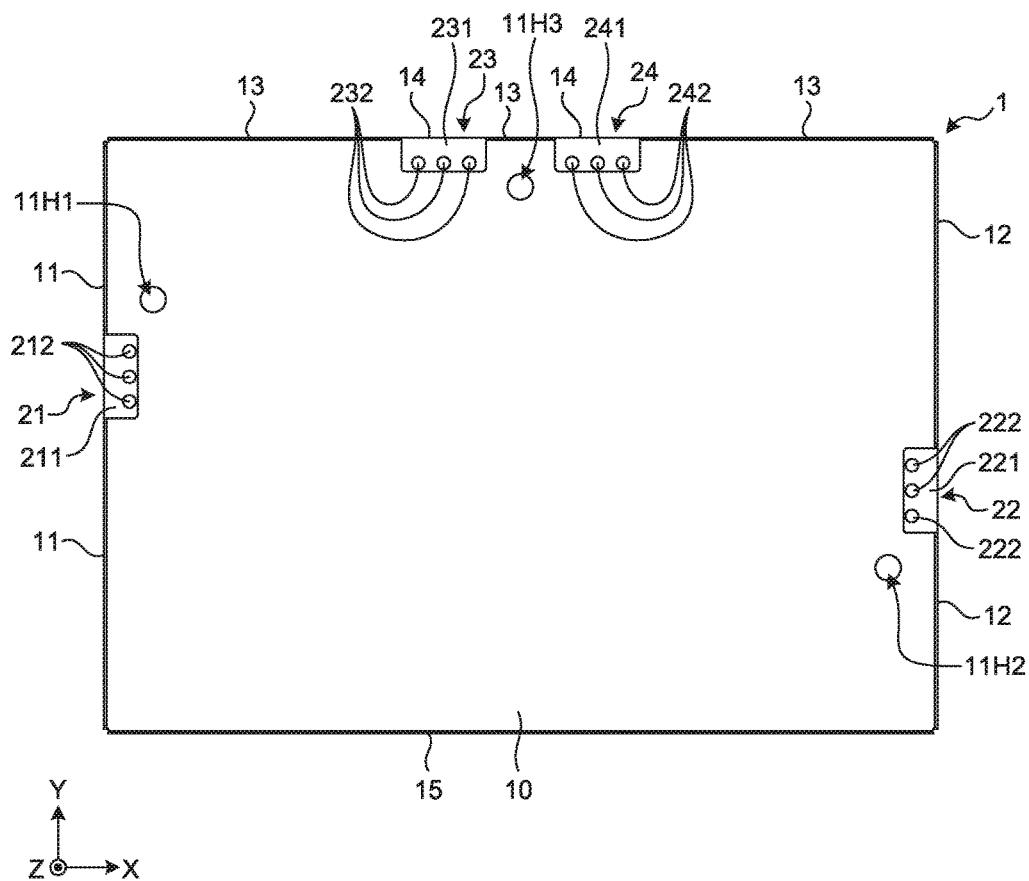
FIG. 4 is a top view of a shield cover.

FIG. 4 is a top view of the shield cover. As illustrated in FIG. 1, FIG. 2, and FIG. 4, the shield cover 1 includes a top plate 10, and side plates 11, 12, 13, 14, and 15 folded along the respective sides of the top plate 10. The side plate 11 faces the side plate 12 in the X direction. The side plates 13 and the side plates 14 face the side plate 15 in the Y direction.

As illustrated in FIG. 1 and FIG. 4, the top plate 10 has through holes 11H1, 11H2, and 11H3. As illustrated in FIG. 1, the through hole 11H1 overlaps the through hole 3H1 and the through hole 5H1. The through hole 11H2 overlaps the through hole 3H2 and the through hole 5H2. The through hole 11H3 overlaps the through hole 5H3.

The shield cover 1 further includes a first contact piece 21, a first contact piece 22, a second contact piece 23, and a second contact piece 24 each facing the upper face side of the top plate 10. The first contact piece 21 is formed by folding a part of the side plate 11 inward; the first contact piece 22 is formed by folding a part of the side plate 12 inward; the second contact piece 23 is formed by folding a part of the side plate 14 inward; and the second contact piece 24 is formed by folding another part of the side plate 14 inward.

As illustrated in FIG. 4, the first contact piece 21 and the through hole 11H1 are disposed in juxtaposition along the side plate 11, their closest side plate. In the X direction, the end of the first contact piece 21 is closer to the side plate 11 than the center of the through hole 11H1. The first contact piece 22 and the through hole 11H2 are disposed in juxtaposition along the side plate 12, their closest side plate. In the X direction, the end of the first contact piece 22 is closer to the side plate 12 than the center of the through hole 11H2. The second contact piece 23, the through hole 11H3, and the second contact piece 24 are disposed in juxtaposition along the side plate 13 (the side plates 14), their closest side plate. In the Y direction, a distance from the corresponding side plate 14 to the second contact piece 23 is shorter than a distance from the side plate 13 to the center of the through hole 11H3. In the Y direction, a distance from the corresponding side plate 14 to the second contact piece 24 is shorter than a distance from the side plate 13 to the center of the through hole 11H3.

Figure 5:
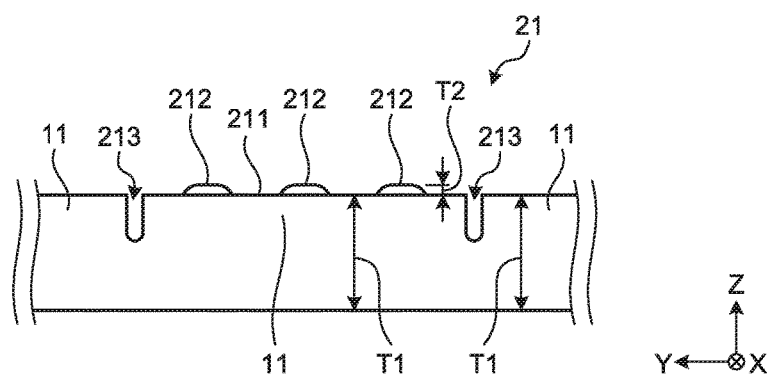
FIG. 5 is a side view of a first contact piece.
Figure 6:
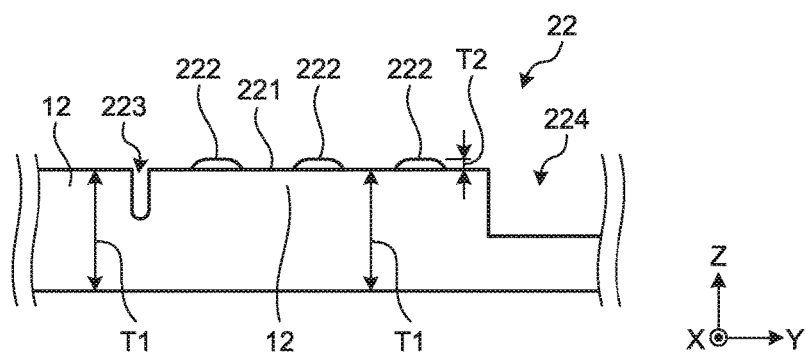
FIG. 6 is a side view of another first contact piece.
Figure 7:
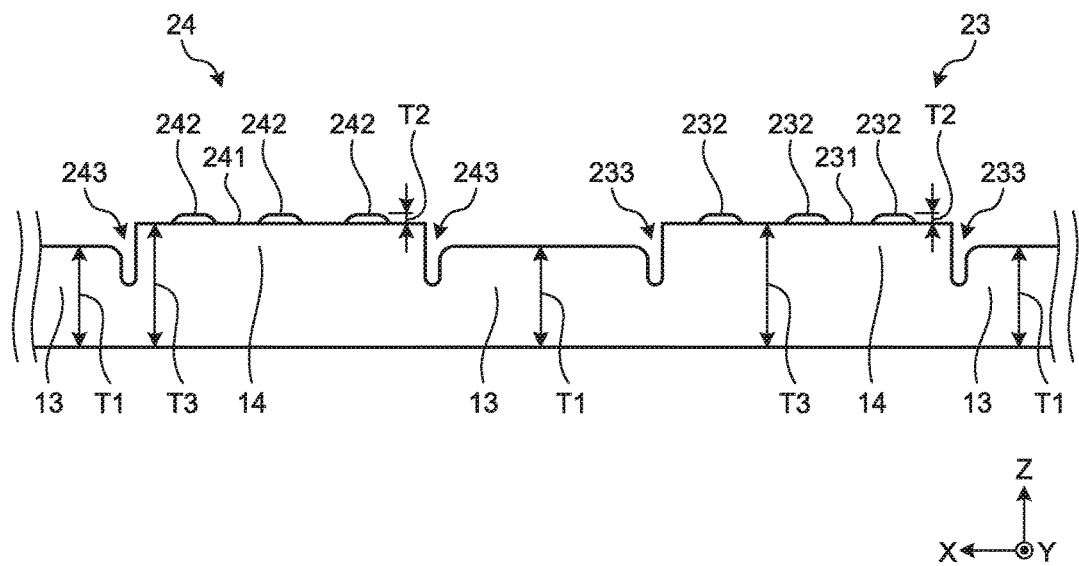
FIG. 7 is a side view of a second contact piece.

FIG. 5 is a side view of the first contact piece 21. FIG. 6 is a side view of the first contact piece 22. FIG. 7 is a side view of the second contact pieces 23 and 24. As illustrated in FIG. 1, FIG. 5, FIG. 6, and FIG. 7, the side plates 11, 12, and 13 have the same height equal to a distance T1 in the Z direction. As illustrated in FIG. 1, the side plate 15 also has the same height as those of the side plates 11, 12, and 13 in the Z direction.

Figure 8:
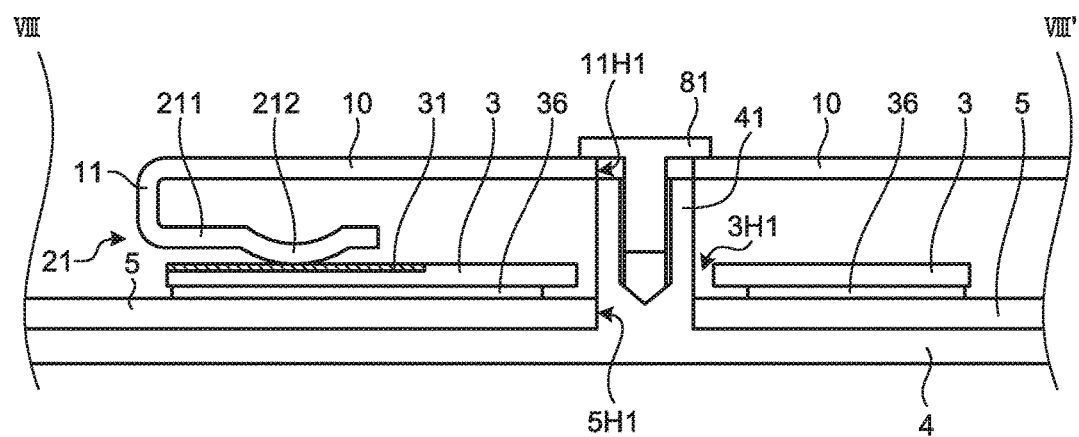
FIG. 8 is a partial sectional view for schematically explaining a section taken along a line VIII-VIII' in FIG. 2.

FIG. 8 is a partial sectional view for schematically explaining a section taken along a line VIII-VIII' in FIG. 2. As illustrated in FIG. 4, FIG. 5, and FIG. 8, the first contact piece 21 includes a plate-like claw 211 and a plurality of protrusions 212 protruding from the upper face of the claw 211. The protrusions 212 are formed by denting the back surface of the claw 211 toward the upper face side. These protrusions 212 protrude by a distance T2 from the upper face of the claw 211 in the Z direction. As illustrated in FIG. 8, the claw 211, the side plate 11, and the top plate 10 are integrally formed, and constitute a U-shaped sectional structure. As illustrated in FIG. 4 and FIG. 5, the protrusions 212 are arranged in juxtaposition in the Y direction, or along one side of the top plate 10.

As illustrated in FIG. 5, notches 213 of the side plate 11 are respectively formed at both sides of the claw 211 in the Y direction. These notches make it easier to form the claw 211 by folding a part of the side plate 11.

As illustrated in FIG. 2, FIG. 3, and FIG. 8, the first contact piece 21 overlaps the ground pattern 31 from a plan view in the Z direction. As illustrated in FIG. 1 and FIG. 8, a male screw 81 is fastened to the boss 41, causing the protrusions 212 of the first contact piece 21 to press the ground pattern 31. As a result, electrical conduction is established between the ground pattern 31 and the shield cover 1.

As illustrated in FIG. 2, the center line CYL of the top plate 10 in the X direction is located midway between the side plate 11 and the side plate 12. The center line CXL of the top plate 10 in the Y direction is located midway between the side plates 13 and 14 and the side plate 15. A reference point CP at the center of the top plate 10 corresponds to an intersection of the center line CYL and the center line CXL.

As illustrated in FIG. 4 and FIG. 6, the first contact piece 22 includes a claw 221 and a plurality of protrusions 222 protruding from the upper face of the claw 221. The protrusions 222 are formed by denting the back surface of the claw 221 toward the upper face side. These protrusions 222 protrude by the distance T2 from the upper face of the claw 221 in the Z direction. As illustrated in FIG. 4, the length of the claw 221 in the X direction is equal to that of the claw 211 in the X direction. The length of the claw 221 in the Y direction is also equal to that of the claw 211 in the Y direction.

As illustrated in FIG. 1, the claw 221, the side plate 12, and the top plate 10 are integrally formed, and constitute a U-shaped sectional structure. As illustrated in FIG. 4, the protrusions 222 are arranged in juxtaposition in the Y direction or along one side of the top plate 10.

As illustrated in FIG. 6, a notch 223 and a notch 224 of the side plate 12 are respectively formed at both sides of the claw 221 in the Y direction. These notches make it easier to form the claw 221 by folding a part of the side plate 12. The FPC board 37 illustrated in FIG. 3 is inserted into the notch 224.

As illustrated in FIG. 1, a male screw 82 is fastened to the boss 42, causing the protrusions 222 of the first contact piece 22 to press the ground pattern 32, similarly to the first contact piece 21. As a result, electrical conduction is established between the ground pattern 32 and the shield cover 1.

As illustrated in FIG. 7, in the Z direction, the height of the side plates 14 is equal to a distance T3 that is larger than the height (distance T1) of the side plates 13. For example, the distance T3 is larger than the distance T1 by a thickness of the printed circuit board 3 and that of the resin film 36. As a result, the second contact piece 23 and the second contact piece 24 each have a larger height than that of the first contact piece 21 and that of the first contact piece 22 in the Z direction.

Figure 9:
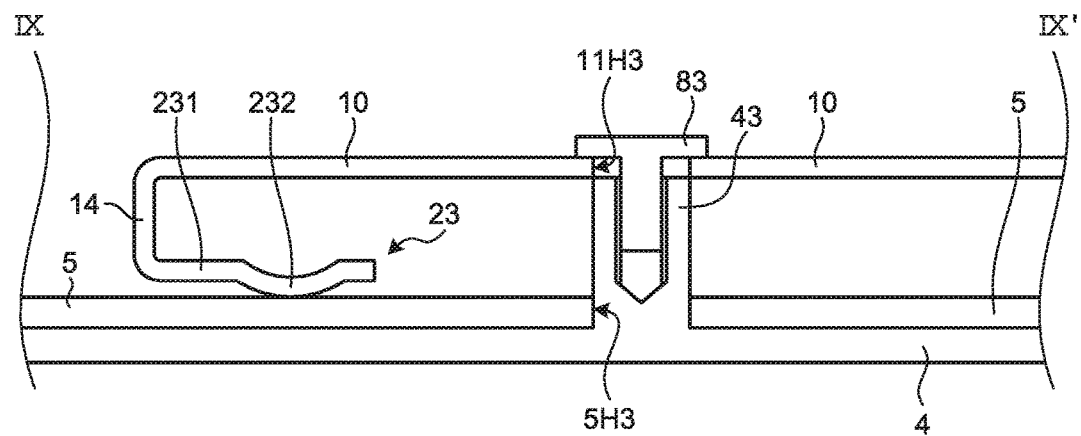
FIG. 9 is a partial sectional view for schematically explaining a section taken along a line IX-IX' in FIG. 2.

FIG. 9 is a partial sectional view for schematically explaining a section taken along a line IX-IX' in FIG. 2. As illustrated in FIG. 7 and FIG. 9, the second contact piece 23 includes a claw 231 and a plurality of protrusions 232 protruding from the upper face of the claw 231. The protrusions 232 are formed by denting the back surface of the claw 231 toward the upper face side. As illustrated in FIG. 7, these protrusions 232 protrude by the distance T2 from the upper face of the claw 231 in the Z direction.

As illustrated in FIG. 9, the claw 231, the corresponding side plate 14, and the top plate 10 are integrally formed, and constitute a U-shaped sectional structure. As illustrated in FIG. 4 and FIG. 7, the protrusions 232 are arranged in juxtaposition in the X direction or along one side of the top plate 10.

As illustrated in FIG. 7, the second contact piece 24 includes a claw 241 and a plurality of protrusions 242 protruding from the upper face of the claw 241. The protrusions 242 are formed by denting the back surface of the claw 241 toward the upper face side. As illustrated in FIG. 7, these protrusions 242 protrude by the distance T2 from the upper face of the claw 241 in the Z direction.

Similarly to the second contact piece 23, the claw 241, the corresponding side plate 14, and the top plate 10 are integrally formed, and constitute a U-shaped sectional structure. As illustrated in FIG. 4 and FIG. 7, the protrusions 242 are arranged in juxtaposition in the X direction or along one side of the top plate 10.

As illustrated in FIG. 7, notches 233 are respectively formed at both sides of the claw 231 in the X direction. Each of the notches 233 is located between the corresponding side plate 13 and the side plate 14. Notches 243 are respectively formed at both sides of the claw 241 in the X direction. Each of the notches 243 is located between the corresponding side plate 13 and the side plate 14. These notches make it easier to form the claws 231 and 241 by folding parts of the respective side plates 14. As illustrated in FIG. 4, the length of the claw 231 and that of the claw 241 in the Y direction are equal to the length of the claw 211 in the X direction. The length of the claw 221 in the X direction is equal to that of the claw 211 in the X direction.

As illustrated in FIG. 9, a male screw 83 is fastened to the boss 43, causing the protrusions 232 of the second contact piece 23 to press the back plate 5. Similarly to the second contact piece 23, the male screw 83 is fastened to the boss 43, causing the protrusions 242 of the second contact piece 24 to press the back plate 5, which is not illustrated. As a result, electrical conduction is established between the back plate 5 and the shield cover 1.

Figure 10:
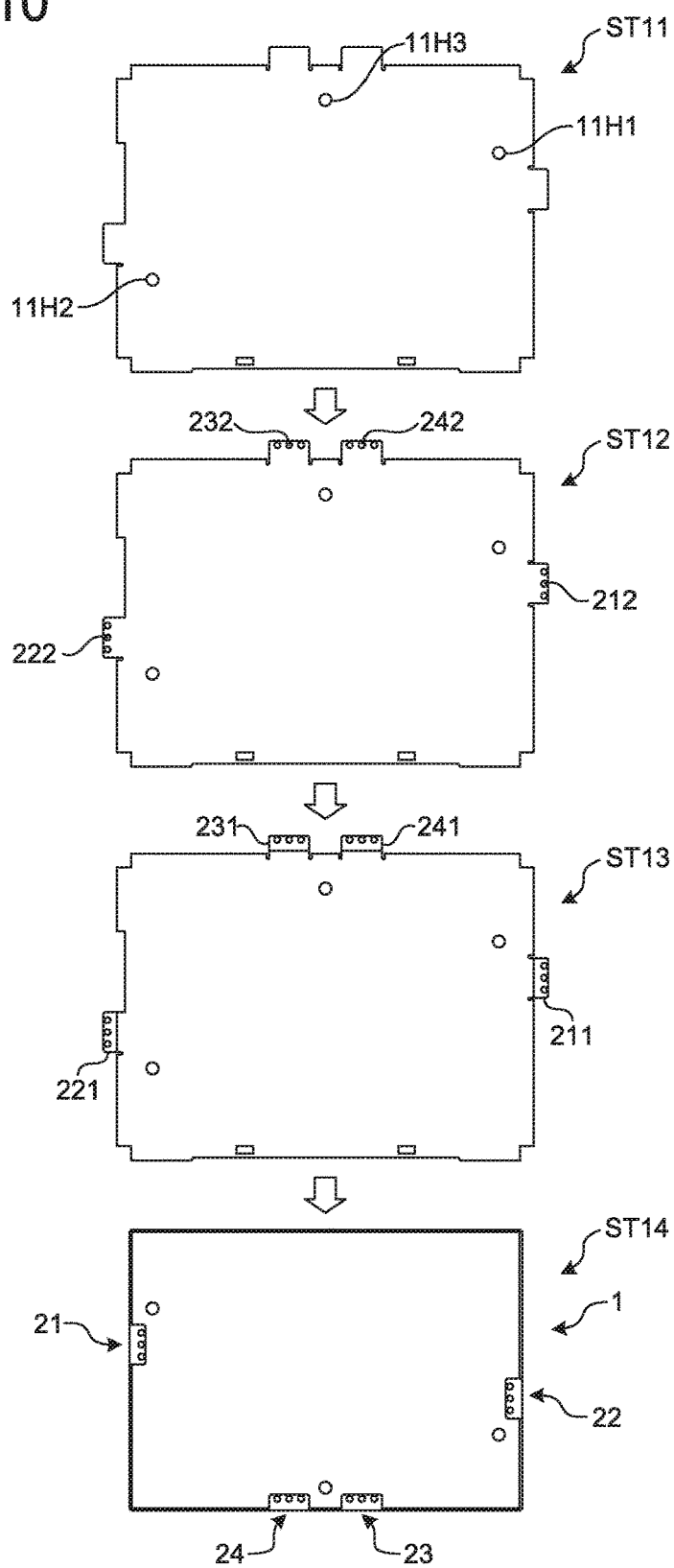
FIG. 10 is a diagram for explaining a procedure for manufacturing the shield cover.
Figure 11:
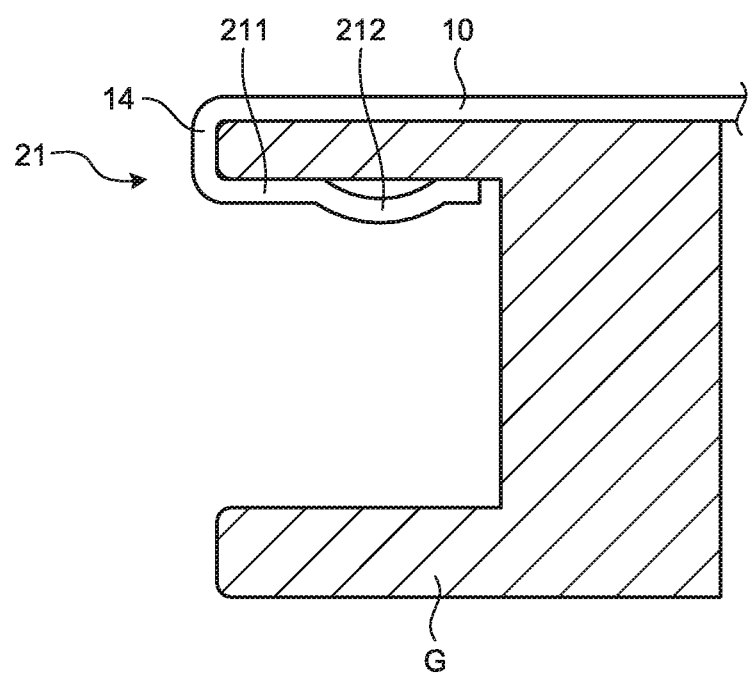
FIG. 11 is a diagram for explaining machining on the shield cover.

FIG. 10 is a diagram for explaining a procedure for manufacturing the shield cover. FIG. 11 is a diagram for explaining machining on the shield cover. First, at Step ST11, a cutting machine performs a cutting process to cut out a plate body subjected to the machining from a metal plate, as illustrated in FIG. 10. The cutting machine may perform press-cutting work on the metal plate using a cutting die, or may cut the metal plate using a laser beam without contacting the metal plate. At Step ST11, necessary through holes are formed in the plate body.

Subsequently, at Step ST12, a pressing machine performs punching work to form the protrusions 212, 222, 232, and 242. Subsequently, as illustrated for Step ST13, the pressing machine performs folding work to form the claws 211, 221, 231, and 241.

Subsequently, at Step ST14, the pressing machine performs folding work on the protrusions 212, 222, 232, and 242, together with the side plates using a jig G illustrated in FIG. 11. Consequently, the first contact piece 21, the first contact piece 22, the second contact piece 23, and the second contact piece 24 are formed.

As described above, the display device 100 includes: the display panel 6; the housing including the back plate 5; the printed circuit board 3; the bosses 41 and 42; the shield cover 1; and the male screws 81 and 82. The printed circuit board 3 includes the ground patterns 31 and 32 on its board surface, and the through holes 3H1 and 3H2. The bosses 41 and 42 at least penetrate the through holes 3H1 and 3H2, respectively, and protrude from a surface of the back plate 5, to which the printed circuit board 3 is attached.

The shield cover 1 includes: the top plate 10 including the through holes 11H1 and 11H2; the side plates 11 and 12 integral with the top plate 10 and disposed at the periphery of the top plate 10; and the first contact pieces 21 and 22. The first contact piece 21 is formed by folding a part of the side plate 11 inward, and includes the protrusions 212 in contact with the ground pattern 31 and the claw 211 facing the top plate 10. The protrusions 212 cause the claw 211 to protrude toward the printed circuit board 3. The first contact piece 22 is formed by folding a part of the side plate 12 inward, and includes the protrusions 222 in contact with the ground pattern 32 and the claw 221 facing the top plate 10. The protrusions 222 cause the claw 221 to protrude toward the printed circuit board 3. The male screws 81 and 82 penetrate the through holes 11H1 and 11H2, respectively, from the outside of the top plate 10 to be fastened to the bosses 41 and 42.

The male screws 81 and 82 are fastened to the bosses 41 and 42, respectively, allowing the protrusions 212 and the protrusions 222 to stably press the corresponding ground patterns 31 and 32. Specifically, fastening power between the male screw 81 and the boss 41 and between and the male screw 82 and the boss 42 is transmitted to the respective side plates 11 and 12, applying force to press the protrusions 212 and the protrusions 222 against the respective ground patterns 31 and 32. The configuration stabilizes contact resistance between the shield cover 1 and the ground patterns 31 and 32.

From a plan view in the Z direction, as illustrated in FIG. 3, the boss 43 is positioned outside of a region in which the printed circuit board 3 is attached. The boss 43 is fastened to the male screw 83 that has passed through the through hole 11H3 of the top plate 10 from the outside of the top plate 10, without penetrating the print circuit board 3. As a result, electrical conduction is established between the back plate 5 and the shield cover 1.

From a plan view in the Z direction, as illustrated in FIG. 4, the position of the second contact piece 23 and that of the first contact piece 24 are line-symmetric about the center line CYL. The position of the first contact piece 21 and that of the first contact piece 22 are point-symmetric about the reference point CP. As a result, the shield cover 1 is supported at three points.

The relative positions of the male screw 81 and the first contact piece 21 and those of the male screw 82 and the first contact piece 22 are point-symmetric about the reference point CP. The male screws 81, 82, and 83 are fastened to the bosses 41, 42, and 43, respectively, making the shield cover 1 fixed to the back plate 5 at three points. As a result, the shield cover 1 is less likely to be misaligned relative to the back plate 5. The male screws 81, 82, and 83 are fastened to the bosses 41, 42, and 43, respectively, causing the first contact pieces 21 and 22 to press the printed circuit board 3 against the back plate 5. This configuration prevents the printed circuit board 3 from warping.

The through hole 3H1 and the ground pattern 31 are disposed in juxtaposition along the side plate 11, the closest side plate to the through hole 3H1. The ground pattern 31 is closer to the side plate 11 than the through hole 3H1 is. This configuration allows fastening power between the male screw 81 and the boss 41 to be easily transmitted through the side plate 11, the fastening power serving as force to press the protrusions 212 against the ground pattern 31.

Likewise, the through hole 3H2 and the ground pattern 32 are disposed in juxtaposition along the side plate 12, the closest side plate to the through hole 3H2. The ground pattern 32 is closer to the side plate 12 than the through hole 3H2 is. This configuration allows fastening power between the male screw 82 and the boss 42 to be easily transmitted through the side plate 12, the fastening power serving as force to press the protrusions 222 against the ground pattern 32.

In general, the display panel 6 tends to be electrically charged easily. Without measures against static electricity, the static electricity may cause malfunction of electronic components, which drive elements for display, on the printed circuit board. Further, because vehicles such as automobiles have enhanced quiet performance, the display device 100 also needs to exhibit quiet performance. In this regard, the display device 100 according to the first embodiment exhibits stable contact resistance between the shield cover 1 and the ground patterns 31 and 32, preventing malfunction of electronic components mounted on the printed circuit board 3. Because the first contact pieces 21 and 22 have spring characteristics, the display device 100, even when mounted on a machine that vibrates such as an automobile, is less likely to generate frictional sound due to friction between the protrusions 212 and the ground pattern 31 and between the protrusions 222 and the ground pattern 32.

In the first embodiment, the backlight 4 has the bosses 41 and 42, which penetrate the through holes 5H1 and 5H2 of the back plate 5, respectively. The male screws 81 and 82 are fastened to the bosses 41 and 42, respectively, causing the backlight 4 to be reliably fixed to the back plate 5. Even when mounted on a machine that vibrates such as an automobile, the display device 100 is less likely to generate frictional sound due to friction between the backlight 4 and the back plate 5.

Second Embodiment

Figure 12:
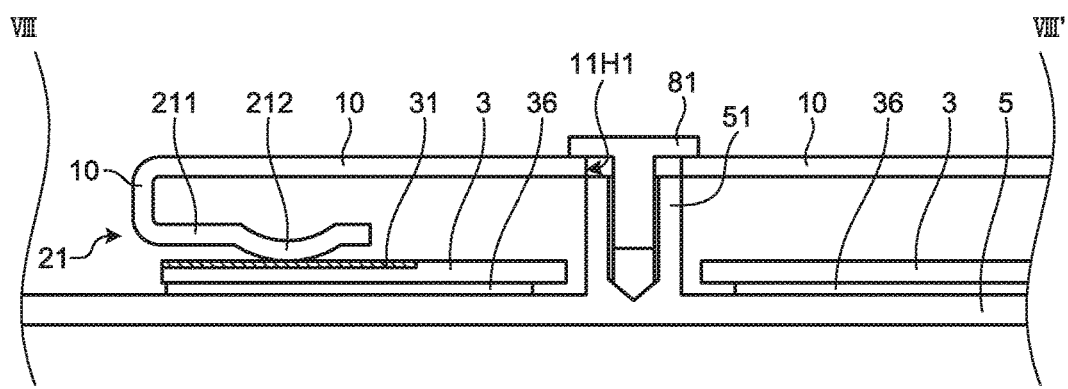
FIG. 12 is a partial sectional view for schematically explaining a section taken along a line VIII-VIII' in FIG. 2 according to a second embodiment of the present disclosure.
Figure 13:
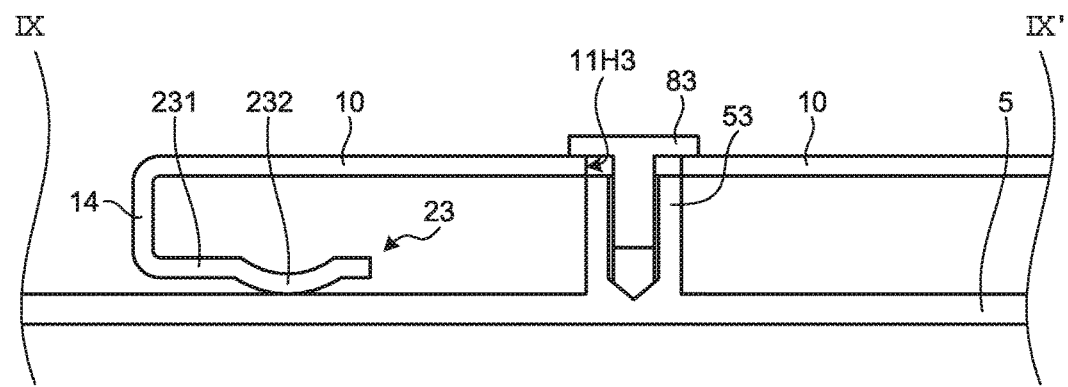
FIG. 13 is a partial sectional view for schematically explaining a section taken along the line IX-IX' in FIG. 2 according to the second embodiment.

FIG. 12 is a partial sectional view for schematically explaining a section taken along the line VIII-VIII' in FIG. 2 according to a second embodiment. FIG. 13 is a partial sectional view for schematically explaining a section taken along the line IX-IX' in FIG. 2 according to the second embodiment. A display device 100 according to the second embodiment includes bosses 51 at positions corresponding to the positions of the through holes 5H1 and 5H2 in the back plate 5 illustrated in FIG. 1, the bosses 51 protruding toward the back surface side. The display device according to the second embodiment includes a boss 53 at a position corresponding to the position of the through hole 5H3 in the back plate 5 illustrated in FIG. 1, the boss 53 protruding toward the back surface side. The bosses 51 and 53 are formed integrally with the back plate 5 by cutting work, deep-drawing work, or the like on the back plate 5.

As illustrated in FIG. 12, a male screw 81 is fastened to the boss 51, causing the protrusions 212 of the first contact piece 21 to press the ground pattern 31. As a result, electrical conduction is established between the ground pattern 31 and the shield cover 1. Although not illustrated, the male screw 82 is fastened to the boss 51 at a position corresponding to the through hole 5H2 in the back plate 5 illustrated in FIG. 1, causing the protrusions 222 of the first contact piece 22 to press the ground pattern 32.

As illustrated in FIG. 13, the male screw 83 is fastened to the boss 53, causing the protrusions 232 of the second contact piece 23 to press the back plate 5. Similarly to the second contact piece 23, the male screw 83 is fastened to the boss 53, causing the protrusions 242 of the second contact piece 24 to press the back plate 5, which is not illustrated.

As a result, electrical conduction is established between the back plate 5 and the shield cover 1.

When the display device 100 according to the second embodiment employs, as the display panel 6, a display panel to light up self-luminous elements such as organic light emitting diodes (OLEDs), the display device 100 can be made thinner by the thickness of the backlight 4. The display device 100 according to the second embodiment may include, as the display panel 6, a liquid crystal display panel as in the first embodiment.

Third Embodiment

Figure 14:
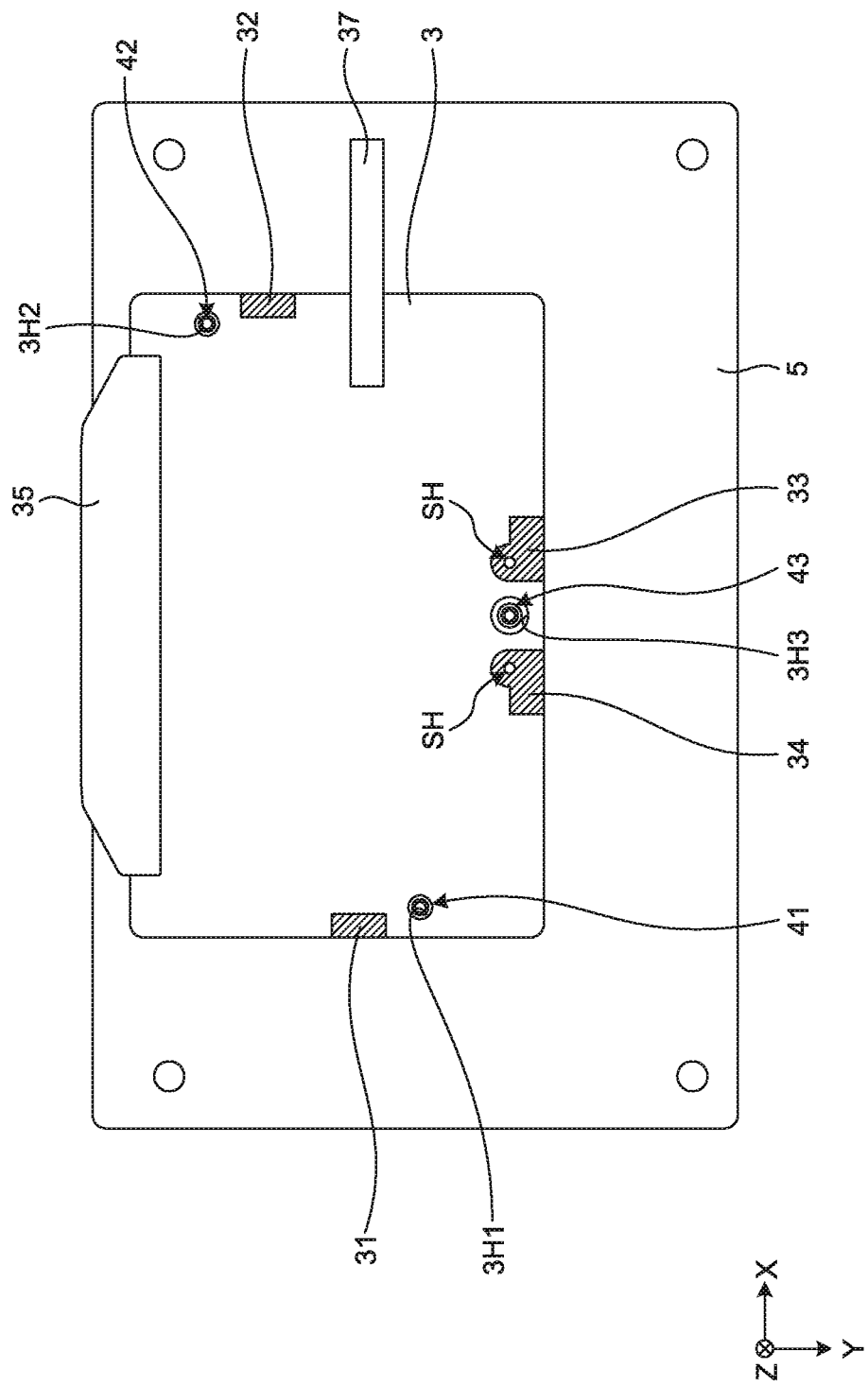
FIG. 14 is a back view for explaining a printed circuit board according to a third embodiment of the present disclosure.
Figure 15:
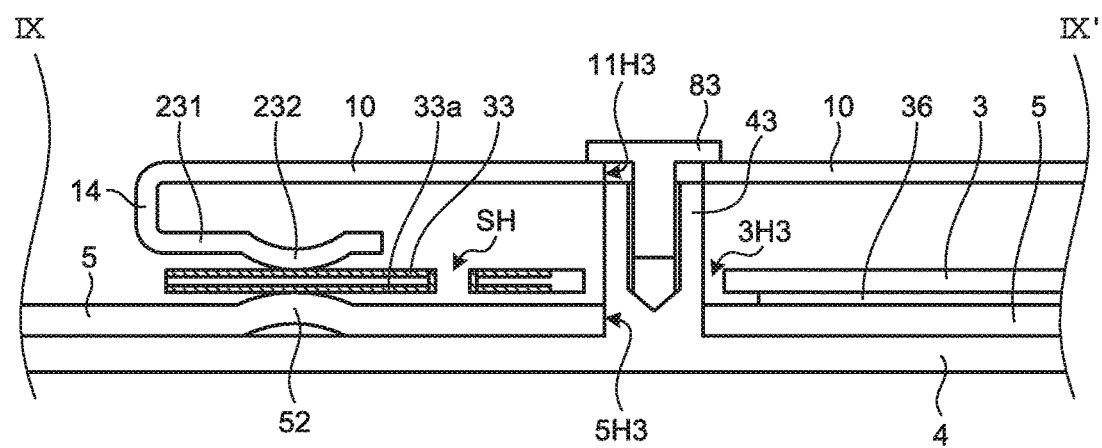
FIG. 15 is a partial sectional view for schematically explaining a section taken along the line IX-IX' in FIG. 2 according to the third embodiment.

FIG. 14 is a back view for explaining a printed circuit board according to a third embodiment. FIG. 15 is a partial sectional view for schematically explaining a section taken along the line IX-IX' in FIG. 2 according to the third embodiment. A display device according to the third embodiment includes a printed circuit board 3 illustrated in FIG. 14 instead of the printed circuit board 3 illustrated in FIG. 1.

As illustrated in FIG. 14, the printed circuit board 3 according to the third embodiment includes: ground patterns 33 and 34 coupled to the reference potential of the printed circuit board 3; and a through hole 3H3. The through hole 3H3 is in the vicinity of the ground patterns 33 and 34. The ground pattern 33 overlaps the second contact piece 23 in a plan view. The ground pattern 34 overlaps the second contact piece 24 in a plan view.

A through-hole SH is formed in the ground pattern 33, and is coupled to a ground pattern 33a on the back surface of the printed circuit board 3, as illustrated in FIG. 15. Likewise, another through-hole SH is formed in the ground pattern 34, and is coupled to another ground pattern on the back surface of the printed circuit board 3.

As illustrated in FIG. 15, the boss 43 of the backlight main body 40 is inserted through the through hole 5H3 of the back plate 5 and the through hole 3H3 of the printed circuit board 3.

As illustrated in FIG. 15, the back plate 5 according to the third embodiment includes protrusions 52 formed by denting the back plate 5 from the upper face side toward the back surface side in the Z direction so as to protrude from the back surface of the back plate 5 at respective positions overlapping the ground patterns 33 and 34 in a plan view. The height of the protrusion 52 from the back surface of the back plate 5 is the same as the thickness of the insulating resin film 36.

As illustrated in FIG. 15, a male screw 83 is fastened to the boss 43, causing the protrusions 232 of the second contact piece 23 to press the ground pattern 33. With the printed circuit board 3 thus pressed, the ground pattern 33a presses the protrusion 52 of the back plate 5, so that the ground pattern 33a comes in contact with the protrusion 52 of the back plate 5.

Similarly to the second contact piece 23, the male screw 83 is fastened to the boss 43, causing the protrusions 242 of the second contact piece 24 to press the ground pattern 34, which is not illustrated. With the printed circuit board 3 thus pressed, the ground pattern on the opposite side of the ground pattern 34 presses the protrusion 52 of the back plate 5, so that the ground pattern comes in contact with the protrusion 52 of the back plate 5.

As described above, the back plate 5 has the protrusion 52 thereon protruding toward the printed circuit board 3. The printed circuit board 3 is sandwiched between the protrusions 232 of the second contact piece 23 and the protrusion 52 of the back plate 5. The protrusions 232 of the second contact piece 23 are in contact with the ground pattern 33, and the protrusion 52 of the back plate 5 is in contact with the ground pattern 33a, the ground patterns 33 and 33a being disposed on the respective opposite surfaces of the printed circuit board 3. As a result, electrical conduction is established between the ground pattern 33 and the shield cover 1.

While an exemplary embodiment according to the present disclosure has been described, the embodiments are not intended to limit the present disclosure. The contents disclosed in the embodiments are given by way of example only, and various changes may be made without departing from the spirit of the present disclosure. Appropriate changes made without departing from the spirit of the present disclosure naturally fall within the technical scope of the present disclosure. For example, an electronic apparatus to which the shield cover 1 according to each of the above embodiments can be applied is not limited to the display device 100, and the shield cover 1 can be applied to a different electronic apparatus. Fastening of each male screw to a corresponding boss is not limited to screwing, and other manners such as self-tapping may be employed.

The present disclosure can naturally provide other advantageous effects that are provided by the aspects described in the embodiments above and are clearly defined by the description in the present specification or appropriately conceivable by those skilled in the art.

What is claimed is:

1. A display device comprising:
a display panel;
a housing that accommodates the display panel;
a printed circuit board including at least one ground pattern on one surface of the printed circuit board and a first through hole;
a first boss that penetrates the first through hole and protrudes from a surface of the housing, the surface being attached to the printed circuit board;
a metallic shield cover attached to the printed circuit board, the metallic shield cover comprising:
a top plate including a second through hole;
side plates integral with the top plate and disposed along the periphery of the top plate; and
a first contact piece formed by folding a part of one of the side plates inward, wherein the first contact piece includes a claw facing the top plate, wherein the claw includes a first protrusion causing the claw to protrude toward the printed circuit board, and wherein the first protrusion is in contact with the at least one ground pattern; and
a first male screw that penetrates the second through hole from outside of the top plate, and that is fastened to the first boss.

2. The display device according to claim 1, wherein
the first through hole and the at least one ground pattern are disposed in juxtaposition along a first side plate that is one of the side plates, the first side plate being the closest plate to the first through hole, and
the at least one ground pattern is closer to the first side plate than the first through hole is.

3. The display device according to claim 1, further comprising:
a second boss that is disposed, in a plan view, at a position outside of a region in which the printed circuit board is attached, and that protrudes from the surface of the housing, the surface being attached to the printed circuit board; and a second male screw that penetrates a third through hole of the top plate from the outside of the top plate, and that is fastened to the second boss.

4. The display device according to claim 2, further comprising:
a second boss that is disposed, in a plan view, at a position outside of a region in which the printed circuit board is attached, and that protrudes from the surface of the housing, the surface being attached to the printed circuit board; and
a second male screw that penetrates a third through hole of the top plate from the outside of the top plate, and that is fastened to the second boss.

5. The display device according to claim 1, wherein
the at least one ground pattern comprises a plurality of ground patterns,
the housing comprises a back plate including a second protrusion that protrudes toward the printed circuit board, and
the first protrusion is in contact with one of the ground patterns on one surface of the printed circuit board, and the second protrusion is in contact with another one of the ground patterns on the other surface of the printed circuit board.

6. The display device according to claim 2, wherein
the at least one ground pattern comprises a plurality of ground patterns,
the housing comprises a back plate including a second protrusion that protrudes toward the printed circuit board, and
the first protrusion is in contact with one of the ground patterns on one surface of the printed circuit board, and the second protrusion is in contact with another one of the ground patterns on the other surface of the printed circuit board.

7. The display device according to claim 1, further comprising a backlight that emits light toward the display panel, wherein
the housing comprises a back plate including a fourth through hole, wherein
the first boss is disposed on the backlight, and
the first boss penetrates the fourth through hole.

8. The display device according to claim 1,
wherein the housing comprises a back plate including the first boss.

* * * * *